US012660624B2

(12) United States Patent
Choi et al.

(10) Patent No.: US 12,660,624 B2
(45) Date of Patent: Jun. 16, 2026

(54) SEMICONDUCTOR MODULE AND SYSTEM INCLUDING THE SAME

(71) Applicant: SK hynix Inc., Icheon-si (KR)

(72) Inventors: Nam Hyeon Choi, Icheon-si (KR);
Seung Jin Ryu, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 676 days.

(21) Appl. No.: 18/104,917

(22) Filed: Feb. 2, 2023

(65) Prior Publication Data

US 2024/0087982 A1     Mar. 14, 2024

(30) Foreign Application Priority Data

Sep. 14, 2022     (KR) ........................ 10-2022-0115491

(51) Int. Cl.
| | |
|---|---|
| *H10W 40/00* | (2026.01) |
| *H01R 12/73* | (2011.01) |
| *H10B 80/00* | (2023.01) |
| *H10W 40/40* | (2026.01) |
| *H10W 40/60* | (2026.01) |

(52) U.S. Cl.
CPC ........ *H10W 40/641* (2026.01); *H01R 12/737* (2013.01); *H10B 80/00* (2023.02); *H10W 40/40* (2026.01)

(58) Field of Classification Search
CPC ... H01L 23/4093; H01L 23/46; H01R 12/737; H10B 80/00; H05K 7/20145; H05K 7/20727

USPC ........................................................ 361/720
See application file for complete search history.

(56) References Cited

U.S. PATENT DOCUMENTS

| | | | | |
|---|---|---|---|---|
| 7,029,307 | B1 * | 4/2006 | Ling | H01R 43/26 |
| | | | | 439/327 |
| 7,654,840 | B1 * | 2/2010 | Zapata | H01R 13/62988 |
| | | | | 439/153 |
| 2010/0296240 | A1 | 11/2010 | Schuette et al. | |
| 2011/0317359 | A1 * | 12/2011 | Wei | F15D 1/0005 |
| | | | | 361/690 |
| 2018/0106853 | A1 * | 4/2018 | Kim | G01R 31/2601 |
| 2021/0037679 | A1 | 2/2021 | Kinsley et al. | |

FOREIGN PATENT DOCUMENTS

JP          2003338594 A      11/2003

* cited by examiner

*Primary Examiner* — Zhengfu J Feng
(74) *Attorney, Agent, or Firm* — WILLIAM PARK AND ASSOCIATES LTD.

(57)          ABSTRACT

A semiconductor module includes a semiconductor module body and a guide. The semiconductor module body extends in a first direction and a second direction intersecting the first direction. A plurality of connection terminals is arranged at one end of the semiconductor module in the second direction. A plurality of semiconductor devices is arranged on at least one side of the semiconductor module body. The guide is arranged at the other end of the semiconductor module body opposite to the one end to induce a flow of a cooling fluid toward the one end of the semiconductor module.

19 Claims, 12 Drawing Sheets

(A)                                        (B)

(A)                                    (B)

SEMICONDUCTOR MODULE AND SYSTEM INCLUDING THE SAME

CROSS-REFERENCES TO RELATED APPLICATION

The present application claims priority under 35 U.S.C. § 119(a) to Korean application number 10-2022-0115491, filed on Sep. 14, 2022, in the Korean Intellectual Property Office, which is incorporated herein by reference in its entirety.

BACKGROUND

1. Technical Field

Various embodiments generally relate to a semiconductor module and a system including the same, more particularly, to a memory module including a memory device and a system including the memory module.

2. Related Art

A semiconductor module including a semiconductor device may be applied to various electronic devices. A typical kind of semiconductor module may be a memory module. A memory module may be classified as a single in-line memory module (SIMM) or a dual in-line memory module (DIMM). A SIMM may include a plurality of memory devices arranged on one surface of a printed circuit board (PCB). A DIMM may include a plurality of memory devices arranged on both surfaces of a PCB.

Because a semiconductor module may have a plurality of memory devices which heat up during operation and have low heat dissipation efficiency, the semiconductor module may require a cooling structure such as a heat spreader. A heat spreader may have a planar shape substantially equal or similar in shape to one side or the other side of the semiconductor module, and may be attached to at least one of the sides of the semiconductor module.

A heat spreader having the above-indicated shape may cause a narrow gap between the semiconductor module and an adjacent semiconductor module to increase an aspect ratio of a streaming space where a cooling fluid may stream. Thus, flow resistance may also be increased to reduce a flow rate of the cooling fluid, thereby greatly reducing cooling efficiency. This problem may be deepened when a cooling fan having high power may be required due to a high-power system is mounted on a motherboard where the semiconductor modules are mounted. Further, cooling efficiency in a specific region of the semiconductor module may be greatly lower than cooling efficiency in other regions of the semiconductor module so that it may be difficult to solve a problem that a local region having a high temperature may exist.

SUMMARY

A semiconductor module in accordance with an embodiment may include a semiconductor module body and a guide. The semiconductor module body may extend in a first direction and a second direction intersecting the first direction. A plurality of connection terminals may be arranged at one end of the semiconductor module in the second direction. A plurality of semiconductor devices may be arranged on at least one side of the semiconductor module body. The guide may be arranged at the other end of the semiconductor module body opposite to the one end to induce a flow of a cooling fluid toward the one end of the semiconductor module.

A system in accordance with an embodiment may include a plurality of the semiconductor modules and a cooling member. The plurality of semiconductor modules may be spaced apart from each other in a third direction intersecting the first direction and the second direction. The cooling member may be configured to provide the semiconductor module with the cooling fluid at one side of the semiconductor modules in the first direction.

According to example embodiments, an aspect ratio may be relatively low by not using a heat spreader, which may cause a narrow gap between the semiconductor modules, to improve cooling efficiency. Further, the guide may be partially positioned corresponding to a downstream region to induce the flow of the cooling fluid to a region adjacent to a lower end of the downstream region having relatively low cooling efficiency. Thus, the region having the relatively low cooling efficiency may be effectively cooled so that the semiconductor module may have improved cooling efficiency. That is, the semiconductor module may have a simple structure with the improved cooling efficiency.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, embodiments of the present teachings should not be construed as limiting the inventive concept. Although a few embodiments of the present teachings will be shown and described, it will be appreciated by those of ordinary skill in the art that changes may be made in these embodiments without departing from the principles and spirit of the present teachings.

Figure 1:
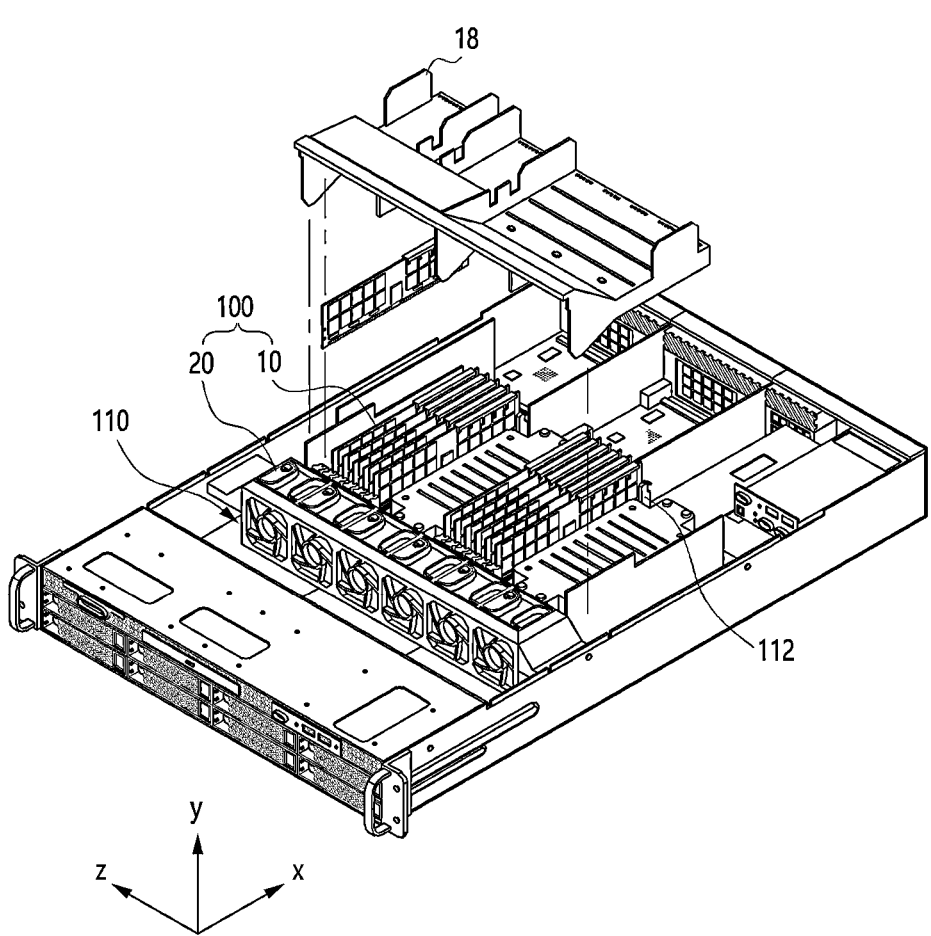
FIG. 1 is an exploded perspective view illustrating a motherboard with a system including a semiconductor module in accordance with an embodiment.

FIG. 1 is an exploded perspective view illustrating a motherboard with a system including a semiconductor module in accordance with an embodiment.

Referring to FIG. 1, a plurality of semiconductor modules 10 and at least one of cooling member 20 may be provided to a motherboard 110 of an embodiment. The cooling member 20 may be arranged at one side of the semiconductor modules 10 to provide the semiconductor modules 10 with a cooling fluid. Hereinafter, the semiconductor modules 10 and the cooling member 20 related to a cooling of the semiconductor modules 10 may be referred to as a system 100 including the semiconductor module illustrated later in detail.

In an embodiment, the motherboard 110 may be a basic and physical hardware including basic circuits and basic parts in a computer capable of a stable driving of the computer, data input/output exchanges, information storages, etc. The motherboard 110 may correspond to a system board, a main board, etc. The semiconductor modules 10 and the cooling member 20 may be installed, for example, at the motherboard 110, but are not limited thereto. Thus, the semiconductor modules 10 and the cooling member 20 may be installed at a circuit board besides the motherboard 110.

As indicated above, the plurality of semiconductor modules 10 may be mounted on the motherboard 110. Particularly, each of the semiconductor modules 10 may have a plate shape extended in a first direction (x-direction in drawings) and a second direction (y-direction in drawings) intersected with each other. For example, the first direction may be substantially perpendicular to the second direction. Thus, the semiconductor module 10 may have a widthwise length along the first direction and a longitudinal length along the second direction. The motherboard 110 may have a plate shape extended in the first direction and a third direction (z-direction in drawings). The third direction may be intersected (or crossed) with the first direction and the second direction.

Particularly, the motherboard 110 may include a plurality of connectors 112 for the semiconductor module 10 provided to a printed circuit board (PCB) including a plurality circuit patterns. The motherboard 110 may include a plurality of connectors 112. Each of the semiconductor modules 10 may be installed at each of the connectors 112. Various structures or types such as a slot, a socket, etc., configured to stably fix the semiconductor module 10 may be applied to the connector 112.

The plurality of connectors 112 may be extended in the first direction. The plurality of connectors 112 may be spaced apart from each other by a uniform gap in the third direction. Thus, the plurality of semiconductor modules 10 substantially perpendicular to the motherboard 110 may be spaced apart from each other by a uniform gap in the third direction.

The plurality of cooling members 20 may be provided to the motherboard 110 to provide the plurality of semiconductor modules 10 with the cooling fluid for cooling heat generated when at least one semiconductor module 10 may be operated.

In an embodiment, the cooling member 20 may include a cooling fan configured to cool the semiconductor modules 10 using an air flow generated by rotating fans of the cooling fan driven by a driving element as a motor. The plurality of the cooling members 20 may be arranged in the third direction to effectively cool the semiconductor modules 10 and other parts on the motherboard 110. Thus, the semiconductor modules 10 may be stably cooled by the above-indicated simple structure, but is not limited thereto. The cooling member 20 may have various types, structures, arrangements, etc.

In an embodiment, the cooling member 20 may be positioned along one side 103 of the semiconductor modules 10 in the first direction. Particularly, the cooling member 20 may be positioned at a left lower region in FIG. 1. Thus, the one side 103 of the semiconductor module 10 in the first direction may be adjacent to the cooling member 20. In contrast, the other side 104 of the semiconductor module 10 corresponding to a right upper region in FIG. 1 may be remote from the cooling member 10.

The cooling fluid of the cooling member 20 may flow toward the other side of the cooling member 20 corresponding to the right upper region in FIG. 1 to cool the semiconductor modules 10. That is, the cooling fluid may flow from the one side 103 of the semiconductor module 10 to the other side 104 of the semiconductor module 10. A region of the semiconductor module 10 adjacent to the cooling member 20, which may be adjacent to the one side 103 of the semiconductor module 10, may form an upstream region UR in FIG. 3 in a flowing direction of the cooling fluid. A region of the semiconductor module 10 remote from the cooling member 20, which may be adjacent to the other side 104 of the semiconductor module 10, may form a downstream region DR in FIG. 3 in the flowing direction of the cooling fluid.

Figure 2:
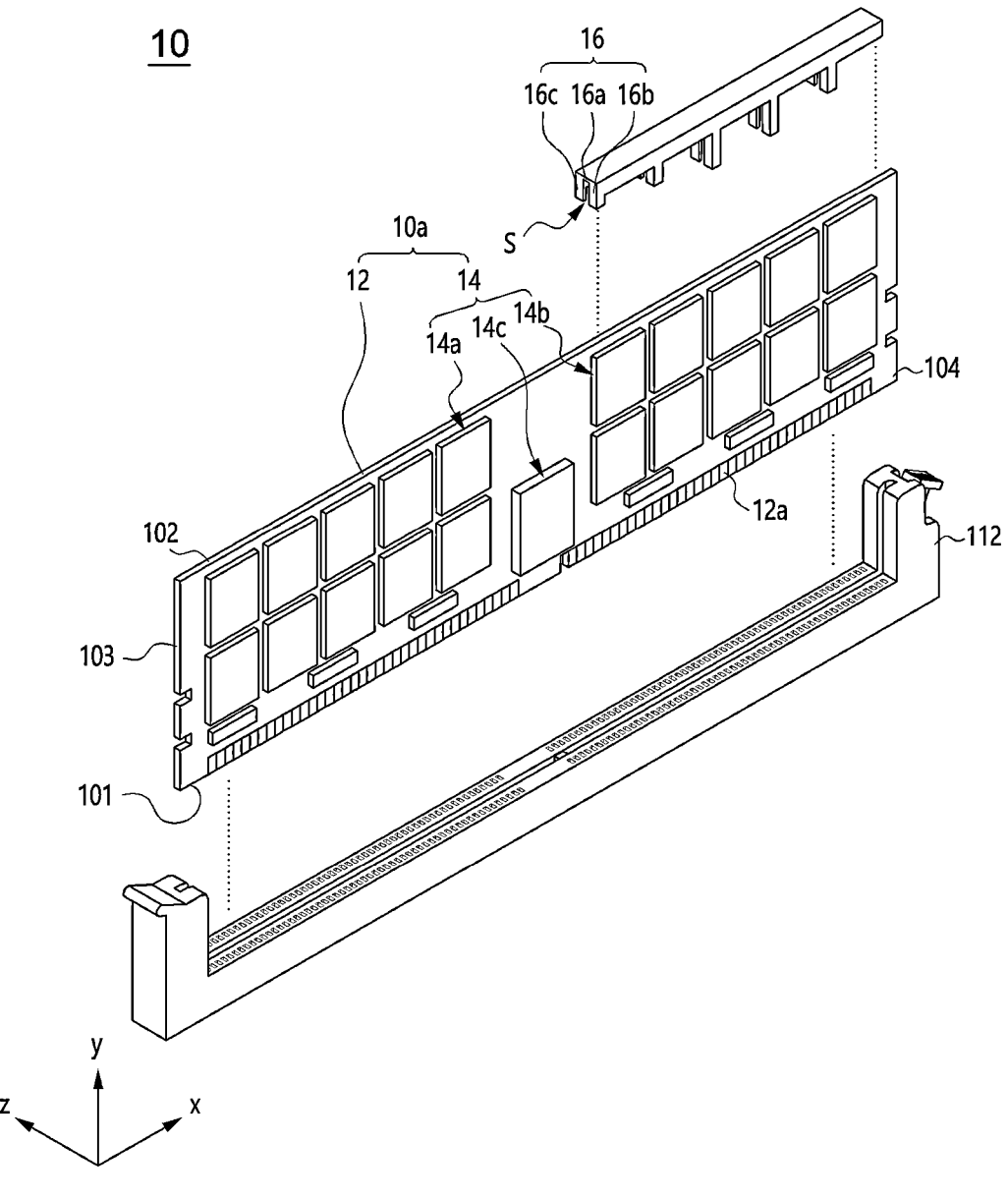
FIG. 2 is an exploded perspective view illustrating a semiconductor module and a connector for the semiconductor module in accordance with an embodiment.

In an embodiment, a guide 16 in FIG. 2 may be provided to at least one of the upstream and downstream regions to improve total cooling efficiency of the semiconductor modules 10. The guide 16 may be described later in detail.

The system 100 may further include a cover 18 configured to cover an upper portion of at least one semiconductor module 10. The cover 18 may be positioned at the upper portion of at least one semiconductor module 10 to stably supply the cooling fluid from the cooling members 20 to a region where the semiconductor module 10 may be positioned. The cover 18 may include a duct, an air shroud, etc.

The cover 18 may be configured to wholly cover the plurality of semiconductor modules 10. For example, one side of the cover 18 adjacent to the cooling member 20 may be detachably or rotatably connected to an upper portion of the other side of the cooling member 20 adjacent to the semiconductor module 10. To attach or detach the semiconductor module 10, the semiconductor module 10 may be readily attached or detached by opening the cover 18. In operating the semiconductor module 10, the cover 18 may be fixed to or combined with the semiconductor modules 10 to stably induce the cooling fluid to the semiconductor modules 10, but is not limited thereto. Thus, the cover 18 may have various shapes. Further, the cover 18 may be combined with other structures, not the cooling member 20.

Additionally, an integrated circuit (IC) chip, a connection terminal for other parts, a central processing unit (CPU), a graphic card, a sound card, etc., may be provided to the motherboard 110. The IC chip, the connection terminal, the CPU, the graphic card, the sound card, etc., may have well-known configurations, arrangements, etc. Thus, any further illustrations with respect to the IC chip, the connection terminal, the CPU, the graphic card, the sound card, etc., may be omitted herein for brevity.

Hereinafter, a semiconductor module 10 of an embodiment applied to the system 100 may be illustrated with reference to FIGS. 2 to 8.

Figure 3:
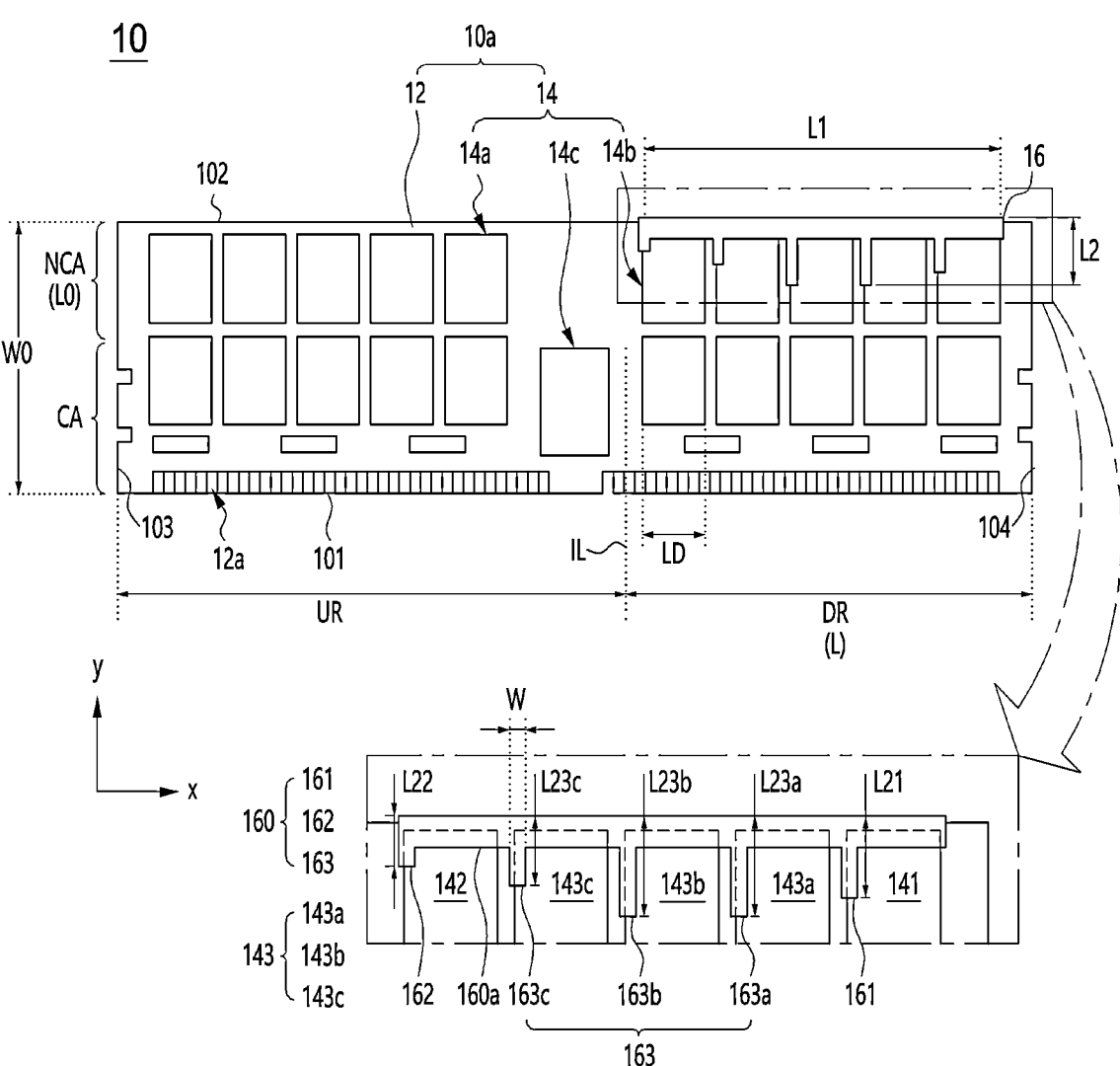
FIG. 3 is a plan view illustrating the semiconductor module in FIG. 2.

FIG. 2 is an exploded perspective view illustrating a semiconductor module and a connector for the semiconductor module in accordance with an embodiment and FIG. 3 is a plan view illustrating the semiconductor module in FIG. 2.

Referring to FIGS. 2 and 3, a semiconductor module 10 of an embodiment may include a semiconductor module body 10a and a guide 16. A plurality of connection terminals 12a may be arranged at one end of the semiconductor module body 10a. A plurality of semiconductor devices 14 may be arranged on at least one side of the semiconductor module body 10a. The guide 16 may be arranged at the other end of the semiconductor module body 10a opposite to the one end to induce the flow of the cooling fluid toward the one end of the semiconductor module body 10a.

In an embodiment, the one end of the semiconductor module body 10a may correspond to a lower portion 101 at which the plurality of connection terminals 12a connected to the connector 112 may be arranged. The other end of the semiconductor module body 10a may correspond to an upper portion 102. The lower portion 101 may correspond to an edge portion positioned adjacent to the motherboard 110. The upper portion 102 may correspond to an edge portion opposite to the edge portion adjacent to the motherboard 110. Thus, embodiments might not be restricted within the descriptions of the lower portion 101 and the upper portion 102.

In an embodiment, the semiconductor module body 10a may include a PCB 12 and the plurality of semiconductor devices 14. The PCB 12 may include the plurality of connection terminals 12a at the lower portion 101. The plurality of semiconductor devices 14 may be arranged on at least one surface of the PCB 12.

Particularly, the PCB 12 may have a plate shape extended in the first direction and the second direction. The PCB 12 may have a first surface and a second surface corresponding to an xy-plane of drawings. Various structures, types, etc., may be applied to the PCB 12. Thus, any further illustrations with respect to the PCB 12 may be omitted herein for brevity.

The plurality of connection terminals 12a for electrically connecting the connector 112 of the motherboard 110 may be provided to the lower portion of the PCB 12. The lower portion 101 of the semiconductor module 101 with the plurality of connection terminals 12a may be inserted into the connector 112 to combine the semiconductor module 10 with the motherboard 110.

The plurality of semiconductor devices 14 may be arranged on the at least one surface of the PCB 12. The plurality of semiconductor devices 14 may include a plurality of memory devices 14a and 14b, a controller 14c, a power management integrated circuit (PMIC), an inductor (not shown), a temperature sensor (not shown), etc.

For example, the plurality of memory devices 14a (hereinafter, the first memory devices) is positioned at one side of the controller 14c and the plurality of memory devices 14b (hereinafter, the second memory devices) positioned at the other side of the controller 14c. For example, some of the plurality of first and second memory devices 14a or 14b may be arranged adjacent to the upper portion 102 and other of the plurality of first and second memory devices 14 or 14b may be arranged adjacent to the lower portion 101.

A controller 14c such as a register clock driver (RCD) may be arranged between the first memory devices 14a and the second memory devices 14b, but is not limited thereto. Functions, numbers, positions, arrangements, etc., of the semiconductor device 14 on the PCB 12 may be variously changed.

In an embodiment, the plurality of semiconductor devices 14 may be arranged on both sides of the PCB 12 to form the memory module 10 in a dual in-line memory module (DIMM), but is not limited thereto. Thus, the plurality of semiconductor devices 14 may be arranged on one side of the PCB 12 to form the memory module 10 in a single in-line memory module (SIMM).

In an embodiment, the guide 16 may be positioned at the upper portion 102 of the semiconductor memory body 10a to induce the cooling fluid to the lower portion 101. For example, the guide 16 may function as a flow-blocking structure configured to block or hinder the flow of the cooling fluid at a region where the guide 16 may be positioned. Particularly, the guide 16 may block a streaming space FS (See FIG. 8) of the upper portion 102 between the adjacent two semiconductor module bodies 10a in the downstream region DR. The guide 16 may be illustrated later in detail with reference to FIG. 8.

In an embodiment, the guide 16 may be positioned corresponding to the downstream region DR in the flowing direction of the cooling fluid. Particularly, the guide 16 might not be arranged at the upstream region UR. The guide 16 may be arranged at the upper portion 102 of the downstream region DR.

The upstream region UR may be a region of the semiconductor module 10 adjacent to the cooling member 20 at which the cooling fluid may arrive in advance. The downstream region DR may be a region of the semiconductor module 10 remote from the cooling member 20 at which the cooling fluid may arrive after the upstream region UR. The upstream region UR and the downstream region DR may be defined by various criteria. In an embodiment, the downstream region DR may be defined as a region where the second memory devices 14b may be positioned. The upstream region UR may be defined as a region where the first memory devices 14a and the controller 14c may be positioned. The one side of the downstream region DR may be defined by a virtual line IL extended from the controller 14c to the other side adjacent to the second memory devices 14b. The other side of the downstream region DR may be defined by the other side (or lower portion) 104 of the semiconductor module 10.

Other parts such as the PMIC may be arranged at the upper portion 102 of a central portion where the controller 14c may be positioned, but is not limited thereto. The downstream region DR may be defined by a region including the controller 14c so that the guide 16 may be positioned toward above the region where the controller 14c is positioned.

In an embodiment, the cooling fluid in the downstream region DR may be induced to the lower portion 101 by the guide 16 positioned corresponding to the downstream region DR. Thus, the cooling efficiency at the lower portion 101 of the downstream region DR, which may have the relatively low cooling efficiency, may be increased to improve the cooling efficiency of the semiconductor module 10. This may be illustrated later in detail with reference to FIG. 5.

The guide 16 may have a widthwise length L1 along the first direction and a longitudinal length L2 along the second direction. The widthwise length L1 may be substantially equal to or less than a widthwise length of the semiconductor module body 10a along the first direction, particularly, a length L of the downstream region DR of the PCB 12. The longitudinal length L2 may be less than a longitudinal length of the semiconductor module body 10a along the second direction, particularly, a width W0 of the PCB 12. The widthwise length L1 of the guide 16 less than the length L of the downstream region DR of the PCB 12 may mean that a maximum value among the widthwise lengths L1 of the guide 16 may be less than a minimum value among the lengths L of the downstream region DR. The longitudinal length L2 of the guide 16 less than the width W0 of the PCB 12 may mean that a maximum value among the longitudinal lengths L2 of the guide 16 may be a minimum value among the widths W0 of the semiconductor module 10.

For example, a ratio of the widthwise length L1 of the guide 16 with respect to the total length of the semiconductor module body 10a, particularly, the PCB 12 might be no more than about 0.5, for example, 0.25 to 0.5. The ratio may be considered when the downstream region DR with the guide 16 may be defined by a region except for the first memory device 14a and the controller 14c, but is not limited thereto. When the guide 16 may be partially arranged, the ratio may be above 0.5.

For example, the longitudinal length L2 of the guide 16 may be less than a length L0 of a region NCA except for a connector region CA where the connector 112 may be positioned. When the longitudinal length L2 of the guide 16 is greater than the length L0 of the region NCA, the flow of the cooling fluid induced to the lower portion 101 by the guide 16 may be interrupted by the connector 112. The longitudinal length L2 of the guide 16 may allow the guide 16 to be overlapped with the second memory device 14b adjacent to the upper portion 102 and not overlapped with the second memory device 14b adjacent to the upper region 101.

In an embodiment, the guide 16 may include an extension 16b and 16c. The extension 16b and 16c may include a plurality of extended portions 160 extended on the one surface of the semiconductor module 10 from the upper portion 102 to the lower portion 101. The guide 16 may include a guide body 16a extended on the upper portion 102 of the semiconductor module body 10a along the first direction. The guide body 16a may be connected to the extension 16b and 16c.

In an embodiment, the extension 16b and 16c may be extended from a region adjacent to the guide body 16a or the upper portion 102 in the first direction to form a connection 160a configured to connect the extended portions 160 with each other along the first direction. The connection 160a may function as to integrate the extended portions 160 to simplify the structure of the guide 16, but is not limited thereto. The guide 16 may include the guide body 16a, and might not include the connection 160a.

The guide body 16a may have a flat plate shape be configured to closely make contact with the upper portion 102. Although the semiconductor module 10 might not have a sufficient upper space, the guide 16 may be applied by the above-indicated structure of the guide body 16a.

The extension 16b and 16c may include a first extension 16b and a second extension 16c. The first extension 16b may extend from one side of the guide body 16a. The first extension 16b may be positioned on one side of the semiconductor module body 10a, particularly, one side of the PCB 12 and the semiconductor devices 14. The second extension 16c may extend from the other side of the guide body 16a. The second extension 16c may be positioned on the other surface of the semiconductor module body 10a, particularly, the other surface of the PCB 12 and the semiconductor device 14. An edge of the semiconductor module 10 in the upper portion 102 may be placed in a space S defined by the guide body 16a, the first extension 16b, and the second extension 16c of the guide 16 to stably fix the guide 16.

The extensions 16b and 16c of the guide 16, especially, at least one of the extended portions 160 may be overlapped with the second memory devices 14b adjacent to the upper portion 102. A space between the second memory devices 14b may be narrow and other parts may be positioned between the second memory devices 14b. Thus, the extensions 16b and 16b may be overlapped with the second memory devices 14b to improve a design degree of freedom.

The extended portions 160 of the extensions 16b and 16c may have a width W narrower than the widthwise length L1 of the guide 16. The extended portions 160 may be extended from the upper portion 102 to the lower portion 101. For example, the extended portions 160 may be extended along the second direction. The extended portions 160 may be spaced apart from each other along the first direction. In FIG. 2, the first extension 16b may include the extended portions 160 and the second extension 16c may include the extended portions 160, but is not limited thereto. For example, any one of the first extension 16b and the second extension 16c may include the extended portions 160. In contrast, the other of the first extension 16b and the second extension 16c might not include the extended portions 160. Further, in FIG. 2, the extended portions 160 of the first and second extensions 16b and 16c may have same or similar widths, lengths and numbers to have a symmetrical shape with respect to the semiconductor module body 10a so that the cooling of the both surfaces in the semiconductor module 10 may be performed equal or similar to each other, thereby improving stability, but is not limited thereto. Any one of the width, the length and the numbers of the extended portions 160 of the first and second extensions 16b and 16c may be different from each other, but is not limited thereto.

The extended portions 160 of the guide 16 may induce the flow of the cooling fluid toward the lower portion 101. An area of the semiconductor module 10 covered by the guide 16 may be minimized. The guide 16 may correspond to the flow-blocking structure. Thus, an area of the guide 16 may be reduced to decrease the flow resistance by the guide 16, thereby stably inducing the flow of the cooling fluid toward the lower portion 101.

In an embodiment, the extended portions 160 may be positioned in one-to-one correspondence with respect to the second memory devices 14b adjacent to the upper portion 102. For example, one of the extend portions 160 may be arranged between the second memory devices 14b which are closely arranged along the first direction. Thus, the cooling fluid in the downstream region DR with the second memory devices 14b may be effectively moved toward the second memory devices 14b adjacent to the lower portion 101. For example, the extended portions 160 may be positioned or adjacent overlapped to one side of each of the second memory devices 14b adjacent to the upstream region UR, i.e., a left region in FIG. 3. When the flow-blocking structure such as the extended portions 160 may be provided, the cooling fluid may recirculate around the extended portions 160 along a solid arrow in FIG. 5. When each of the extended portions 160 may be positioned at the upstream region of the second memory device 14b, the recirculated cooling fluid may effectively cool the second memory devices 14b.

The extended portions 160 may include extended portions 161, 162, and 163 having different lengths. For example, the extended portion 160 adjacent to the second memory device 14b in a central region of the downstream region DR may have a length longer than a length of the extended portion 160 adjacent to the second memory device 14b adjacent to both sides of the downstream region DR.

Particularly, the second memory devices 14b may include a first device 141 spaced far from the controller 14c, a second device 142 adjacent to controller 14c and at least one internal device 143 between the first device 141 and the second device 142. In FIG. 3, the internal device 143 may include a first internal device 143a, a second internal device 143b, and a third internal device 143c in the first direction from the first device 141 to the second device 142. However, the internal device 143 may include one or plural in accordance with designs.

The extended portion 163 corresponding to the internal device 143 may have lengths L23a, L23b, and L23c longer than a length L21 of the extended portion 161. The lengths L23a, L23b, and L23c of the extended portion 163 may be longer than a length L22 of the extended portion 162 corresponding to the second device 142. The internal device 143 in a region adjacent to the lower portion 101 may have cooling efficiency lower than cooling efficiency of the first device 141 to which an external air may make contact with and cooling efficiency of the second device 142 at which the cooling fluid may arrive in advance. Thus, the extended portion 163 corresponding to the internal device 143 may have the relatively long length to effectively induce the cooling fluid to the lower portion 101.

For example, ends of the extended portions 160 adjacent to the lower portion 101 may have a streamlined shape in the flowing direction of the cooling fluid. The length L22 of the extended portion 152 corresponding to the second device 142, the length L23c of the third extended portion 163c corresponding to the third internal device 143c and the length L23b of the second extended portion 163b corresponding to the second internal device 143b may be gradually increased. The length L23a of the first extended portion 163a corresponding to the first internal device 143a may be equal to or greater than the length L23b of the second extended portion 163b. The length L21 of the extended portion 161 corresponding to the first device 141 may be less than the length L23a of the first extended portion 163a. Thus, the cooling fluid may flow in the streamlined shape so that the cooling fluid may flow smoothly from the lower portion 101 to the internal device 143, particularly, the first and second internal devices 143a and 143b having the low cooling efficiency.

In an embodiment, the guide 16, particularly, the extended portion 160 may be arranged along an entirety of the second memory devices 14b adjacent to the upper portion 102 to stably induce the flow of the cooling fluid in the whole region of the downstream region DR, but is not limited thereto. The guide 16, particularly, the extended portion 160 may be formed corresponding to a part of the second memory devices 14b adjacent to the upper portion 102. That is, as indicated above, the internal device 143, particularly, the first and second internal devices 143a and 143b adjacent to the lower portion 101 may have the low cooling efficiency. Thus, the extended portion 160 of the guide 16 may be formed corresponding to the first and second internal devices 143a and 143b. For example, the length of the guide 16 may be longer than the length of the first and second internal devices 143a and 143b, i.e., two times the widthwise length LD of the second memory device 14b so that the guide 16 may be arranged on all upper portions of the first and second internal devices 143a and 143b, but is not limited thereto. For example, the guide 16 may be formed at only the single internal device 143.

In FIGS. 2 and 3, the lengths L23a and L23b of the first and second extended portions 163a and 163b corresponding to the first and second internal devices 143a and 143b may be substantially equal to each other, but is not limited thereto. This structure may prevent the block of the cooling fluid by the long length L23a of the first extended portion 163a.

The shape of the guide 16 may be as illustrated, for example. Alternatively, the shape of the guide 16 such as the length, the arrangements, the numbers of the extended portion 160, the formation of the connection 160a, etc., may be variously changed and changed shapes may also be included in the scope of the present teachings.

In an embodiment, the guide 16 may include a material having a thermal conductivity higher than that of a material in the first and second memory devices 14a and 14b. For example, the guide 16 may include a metal such as aluminum, copper, etc. Thus, the guide 16 may have a low temperature by the cooling fluid to decrease the temperature of the second memory device 14b.

Alternatively, the guide 16 may include a resin or rubber. When the guide 16 includes resin, the guide 16 may be readily manufactured by an injection molding process to reduce a cost of the guide 16. When the guide 16 includes rubber, the guide 16 may be stably combined with the semiconductor module body 10a by a resilient force and/or a frictional force. Further, the guide 16 may absorb an external impact to improve a structural stability of the semiconductor module body 10a.

The guide 16 may be fixed to the upper portion 102 of the semiconductor module body 10a by various manners. The fixing of the guide 16 may be illustrated in detail with reference to FIG. 4.

Figure 4:
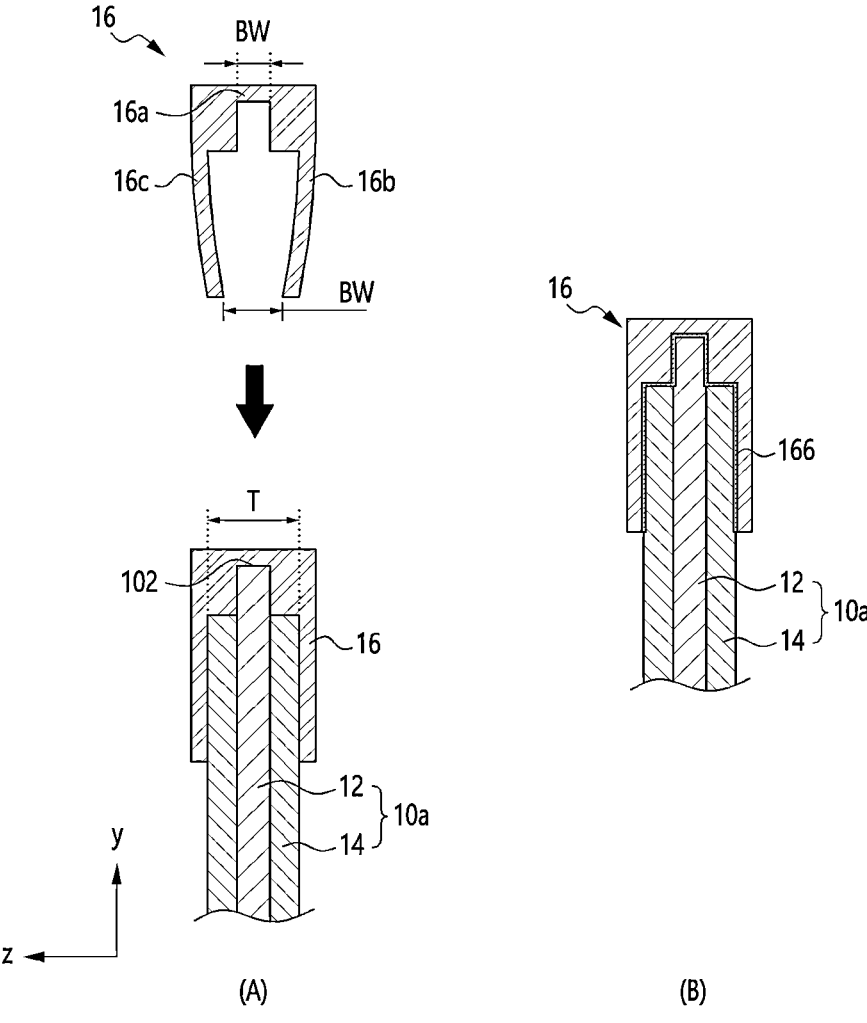
FIG. 4 is a cross-sectional view illustrating various fixing structures of a guide in a semiconductor module in accordance with an embodiment.

FIG. 4 is a cross-sectional view illustrating various fixing structures of a guide in a semiconductor module in accordance with an embodiment.

Referring to FIG. 4A, the guide 16 may be fixed to the upper portion of the semiconductor module body 10a by an insertion combination, a combination by a resilient force and/or a frictional force, etc. For example, the first and second extended portions 16b and 16c of the guide 16 may gradually approach to each other in a downward direction so that a gap BW between lower ends of the first and second extended portions 16b and 16c may be less than a thickness T of the semiconductor module body 10a. When the guide 16 having the above-indicated structure may be inserted into the upper portion 102 of the semiconductor module body 10a, the lower ends of the first and second extended portions 16b and 16c may be widened to have a gap wider than the gap BW so that the guide 16 may be fixed to the upper portion 102 of the semiconductor module body 10a. The cover 18 on the semiconductor module body 10a may prevent the guide 16 from being released, but is not limited thereto.

Alternatively, when the gap between the first and second extended portions 16b and 16c of the guide 16 may be equal or similar to the thickness T of the semiconductor module body 10a, the guide 16 may be fixed to the upper portion 102 of the semiconductor module body 10a by the resilient force or the frictional force. Further, when the guide 16 may be positioned on the semiconductor module body 10a, the cover 18 over the guide 16 may prevent the release of the guide 16.

Referring to FIG. 4B, the guide 16 may be fixed to the upper portion 102 of the semiconductor module body 10a using an adhesive member such as an adhesive 166. That is, the guide 16 may be attached to the semiconductor module body 10a using the adhesive 166 on an inner surface of the guide 16. The adhesive 166 may include a thermal tape, an adhesive paste, etc.

Alternatively, the guide 16 may be fixed to the semiconductor module body 10a by various structures and manners. As shown in FIG. 4, a stepped portion may be formed on the inner surface of the guide 16. The stepped portion may be configured to receive a step formed by the PCB 12 and the other memory device 14b.

Hereinafter, the flow of the cooling fluid and the improvements of the cooling efficiency of the semiconductor module 10 may be illustrated with reference to FIGS. 2, 3 and 5 to 7.

When the semiconductor module 10 may be operated, the semiconductor devices 14 positioned at the lower portion 101 of the semiconductor module 10 may have a temperature higher than a temperature of the semiconductor devices 14 positioned at the upper portion 102 of the semiconductor module 10. This may be caused by the connector 112 configured to interrupt the flow of the cooling fluid in the lower portion 101 of the semiconductor module 10 on the motherboard 110. Thus, when the flow of the cooling fluid might not be controlled, a great amount of the cooling fluid may pass through the region adjacent to the upper portion 102 of the semiconductor module 10. In contrast, a small amount of the cooling fluid may flow to the region adjacent to the lower portion 101 of the semiconductor module 10. Therefore, a heat transfer by convection in the lower portion 101 of the semiconductor module 10 may be decreased so that the cooling efficiency may become low.

Further, the temperature of the cooling fluid in the downstream region DR may be higher than the temperature of the cooling fluid in the upstream region UR along the flowing direction of the cooling fluid. The cooling fluid may approach to the upstream region UR in advance to effectively cool the upstream region UR. In contrast, because the temperature of the cooling fluid passing through the upstream region UR may become high, the cooling efficiency may be decreased.

Therefore, when the flow of the cooling fluid might not be controlled, the cooling efficiency may be decreased closer to the downstream region DR and the lower portion 101 so that the temperature of the semiconductor module 10 or the first and second memory devices 14a and 14b may be increased.

Figure 5:
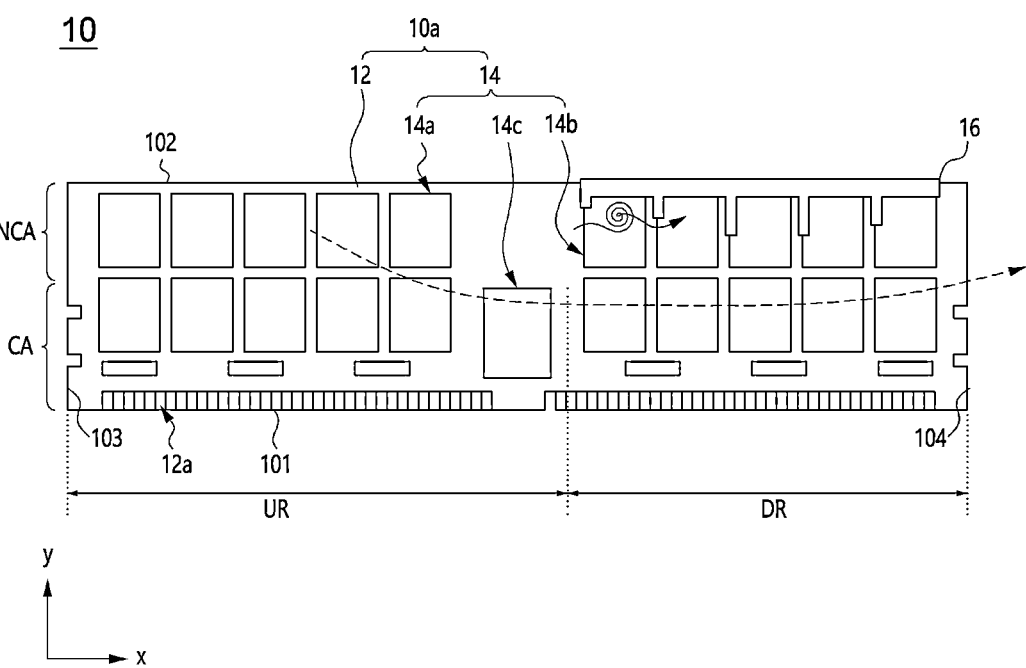
FIG. 5 is a plan view illustrating a flow of a cooling fluid in a semiconductor module in accordance with example embodiments.

In an embodiment, the cooling fluid may be moved along a dashed arrow in FIG. 5 by the guide 16 in the semiconductor module 10. That is, the cooling fluid may be induced to the lower portion 101 having the low cooling efficiency in the downstream region DR by the guide 16. Thus, the cooling fluid may uniformly flow in the upstream region UR. The cooling fluid may flow relatively more in the region adjacent to the lower portion 101 than the region adjacent to the upper portion 102 in the downstream region DR. The cooling efficiency of the lower portion 101 in the downstream region DR may be improved to effectively cool the lower portion 101 in the downstream region DR. Therefore, the problem caused by the cooling fluid, which may be mainly moved to the upper portion 102 of the semiconductor module 10 by the connector 112, may be effectively prevented.

The guide 16 might not be provided to the upper region UR along the flowing direction of the cooling fluid to reduce the flow resistance. In contrast, when the guide may be positioned in the upstream region UR, the flow resistance of the cooling fluid may be increased by the guide to decrease the cooling efficiency of the semiconductor module 10.

As shown the solid arrow in FIG. 5, the cooling fluid may recirculate around the extended portion 160. The recirculated cooling fluid may be moved into the other side 104 of the semiconductor module 10. Thus, the cooling efficiency of the other memory device 10b at the upper portion 102 of the downstream region DR may be maintained, not decreased.

Figure 6:
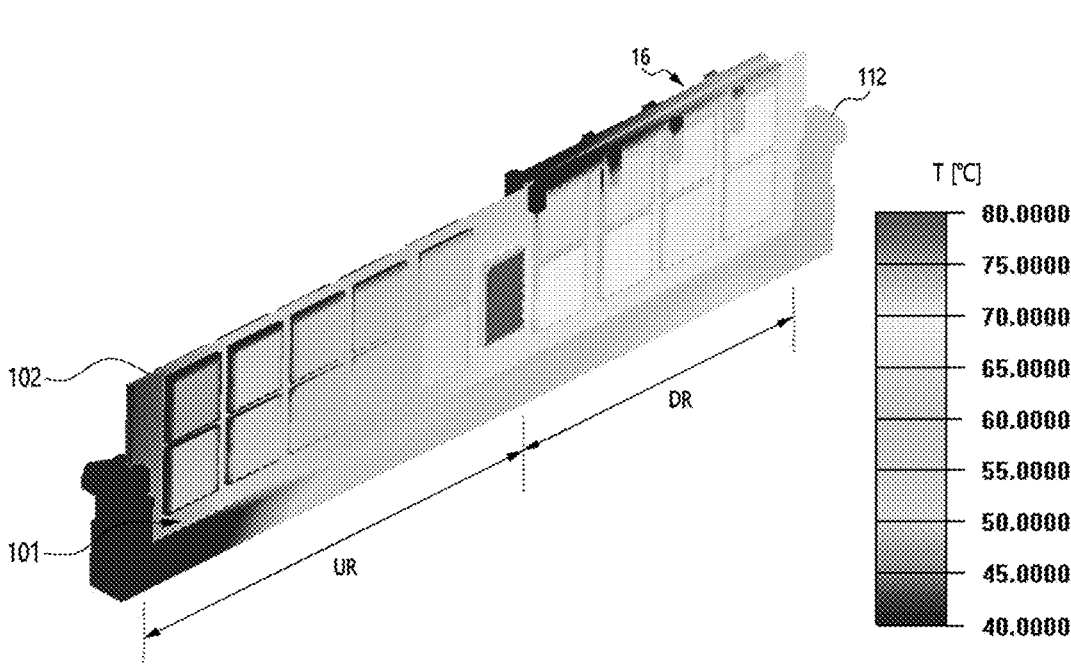
FIG. 6 is a view illustrating simulation results of a semiconductor module with a guide in accordance with an embodiment.
Figure 7:
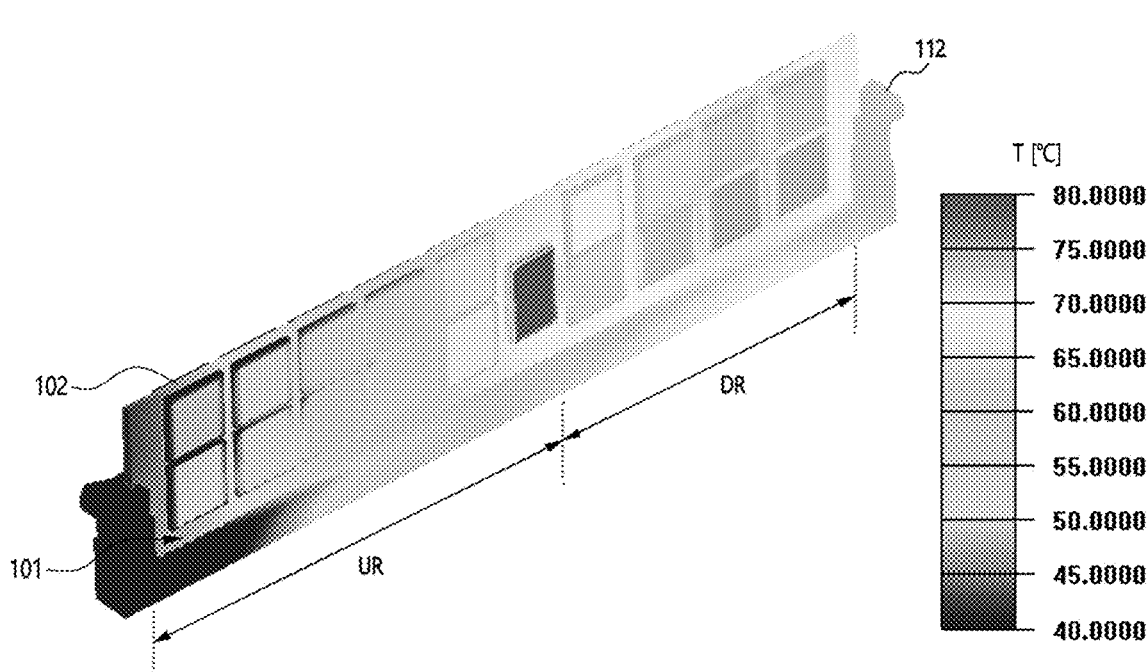
FIG. 7 is a view illustrating simulation results of a semiconductor module without a guide.

FIG. 6 is a view illustrating simulation results of a semiconductor module with a guide in accordance with an embodiment and FIG. 7 is a view illustrating simulation results of a semiconductor module without a guide. The simulations was performed under a wind tunnel environment, at an approach velocity of 1.5 m/s and at a temperature of 40° C. A consumption power of the semiconductor module was 10.6 W. The semiconductor module was mounted on the connector 112. The semiconductor module in FIG. 7 had a structure substantially the same as that of the semiconductor module in FIG. 6 except for the guide.

As shown in FIG. 6, it can be noted that the upper portion 102 and the lower portion 101 in the downstream region DR of the semiconductor module had similar temperatures. The temperature of the lower portion 101 in the downstream region DR was 79.2° C. That is, the guide 16 can improve the cooling efficiency of the lower portion 101 in the downstream region DR. In contrast, it can be noted that a temperature of the lower portion 101 in the downstream region DR was greatly increased relatively more than a temperature of the upper portion 102. The temperature of the lower portion 101 in the downstream region DR was 83.7° C. That is, when the semiconductor module does not include the guide, as shown in FIG. 7, it can be noted that the lower portion 101 in the downstream region DR might not be sufficiently cooled. As a result, the temperature of the lower portion 101 may be increased to generate performance deteriorations of the semiconductor module.

In an embodiment, the guide 16 may function as the flow-blocking structure in the upper portion 102 of the semiconductor module 10 to minimize a pressure drop by the guide 16. This may be illustrated in detail with reference to FIGS. 8 and 9.

Figure 8:
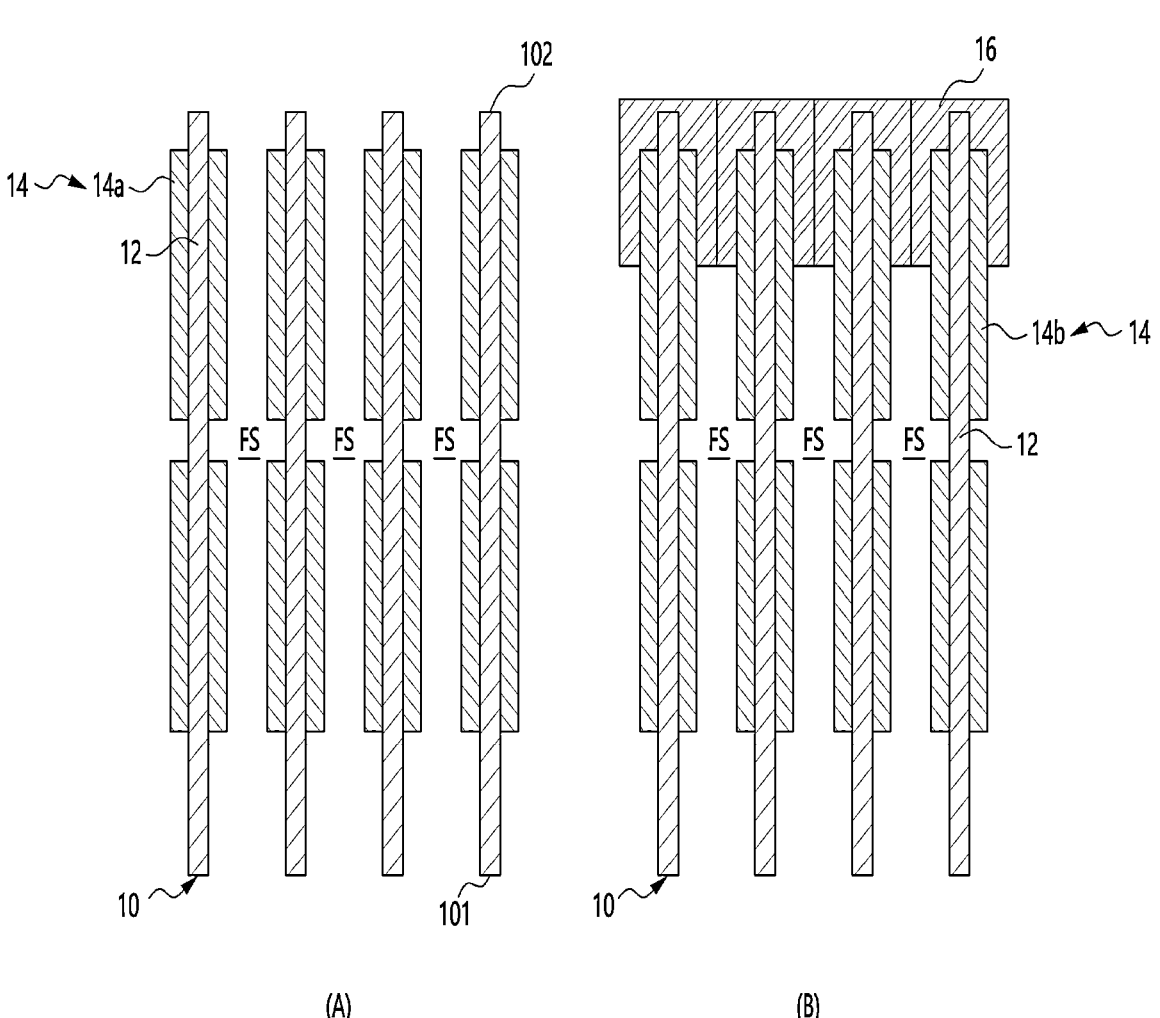
FIG. 8 is a cross-sectional view illustrating a system including a plurality of semiconductor modules in accordance with an embodiment.

FIG. 8 is a cross-sectional view illustrating a system including a plurality of semiconductor modules in accordance with an embodiment. FIG. 8A is a cross-sectional view illustrating a region without the guide. FIG. 8B is a cross-sectional view illustrating a region with the guide. For accurate descriptions, portions directly non-related to an embodiment may be omitted in FIG. 8.

The guide 16 of an embodiment may block or interrupt the flow of the cooling fluid in the upper portion 102 of the two adjacent semiconductor modules 10. Alternatively, the guide may block or the interrupt the flow of the cooling fluid together with an adjacent guide 16. The blocking or the interrupting of the cooling fluid may mean that the cooling fluid in a small space may have a very slow velocity to be determined as a non-flow state of the cooling fluid as well as the fully blocking of the cooling fluid. For example, when a distance between the guides 16 may be no more than about 1 mm, for example, about 0.5 mm, the flow of the cooling fluid may be actually blocked.

Thus, the guide 16 may function as the flow-blocking structure in the upper portion 102 of the semiconductor module 10. As shown in FIG. 8, an aspect ratio of a flow space FS, i.e., a ratio of a length of the semiconductor module with respect to a gap between the two semiconductor modules 10 in the region with the guide 16 may be lower than an aspect ratio of the flow space FS in the region without the guide 16. This may be caused by blocking an upper region of the flow space FS in the region with the guide 16 by the guide 16 to decrease the length of the flow space FS. Therefore, the guide 16 may reduce the aspect ratio of the flow space FS to minimize an increase of the flow resistance by the guide 16.

In contrast, according to conventional arts, in order to improve the cooling efficiency, a heat spreader may be attached to both surfaces of the semiconductor module in place of the guide. However, a gap between the semiconductor modules may be narrowed so that the flow space may have a thin and long quadrangular shape to increase an aspect ratio. When the aspect ratio in a same cross-sectional area is increased, more of a pressure drop may be generated to increase the flow resistance. This may be illustrated in detail with reference to FIG. 9.

Figure 9:
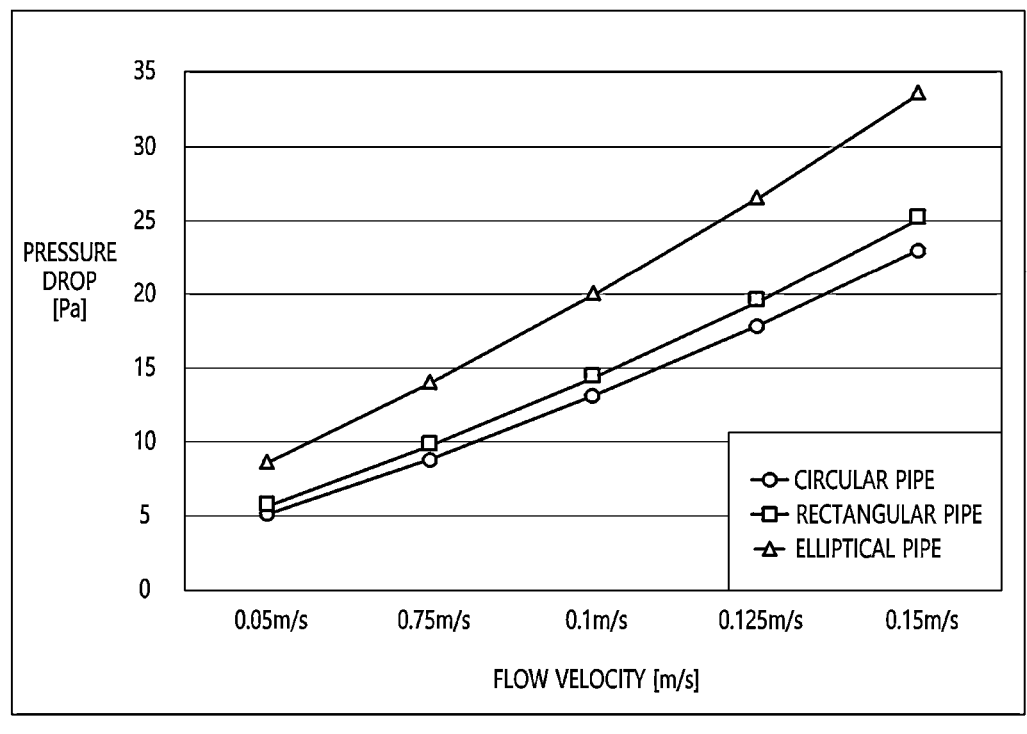
FIG. 9 is a graph showing pressure drop values in accordance with flow velocities in a circular pipe, a rectangular pipe and an elliptical pipe.

FIG. 9 is a graph showing pressure drop values in accordance with flow velocities in a circular pipe, a rectangular pipe, and an elliptical pipe. The circular pipe, the rectangular pipe, and the elliptical pipe may have substantially the same cross-sectional area. The circular pipe may have an aspect ratio greater than an aspect ratio of the rectangular pipe. An aspect ratio of the rectangular pipe may be greater than an aspect ratio of the elliptical pipe.

Referring to FIG. 9, although the pipes may have the same cross-sectional area, the rectangular pipe may have a pressure drop higher than a pressure drop of the circular pipe. Further, a pressure drop of the elliptical pipe may be higher than the pressure drops of the circular pipe and the rectangular pipe.

That is, when the planar heat spreader is applied to the semiconductor module, the aspect ratio may be increased to generate more of the pressure drop. Thus, a flow rate of the cooling fluid may be decreased to reduce the cooling efficiency. This problem may be deepened when a cooling member 20 having high power consumption may be required by high power of a part on the motherboard 10.

In contrast, according to an embodiment, the heat spreader might not be provided in the upstream region UR to increase the distance between the semiconductor modules 10, i.e., the width of the flow space FS, thereby decreasing the aspect ratio compared to the conventional art with the heat spreader. The guide 16 might not be provided in the upstream region UR to prevent the increasing of the pressure drop caused by the guide 16.

Further, because the heat spreader might not be provided in the downstream region DR, the increasing of the aspect ratio by the heat spreader may be prevented. The guide 16 may decrease the aspect ratio to minimize the increasing of the pressure drop by the guide 16. The guide 16 may induce the flow of the cooling fluid to the lower portion 101 to effectively cool the region having the low cooling efficiency. That is, the guide 16 as the flow-blocking structure may be installed at the upper portion 102 of the flow space FS considered when the pressure drop increased in decreasing the length of the flow space FS may be less than the pressure drop increased in decreasing the width of the flow space FS.

The cover 18 may be arranged at the upper portion 102 of the semiconductor module 10 to fully supply the cooling fluid from the cooling member 20 to the semiconductor module 10. Because other structures may be positioned at the upper portion 102 of the semiconductor module 10 without the cover 18, it may be difficult to provide the upper portion 102 of the semiconductor module 10 with a structure having a large volume, for example, a thick thickness. In an embodiment, the guide body 10a having a thin thickness may be placed on the upper portion 102 of the semiconductor module 10 to improve the cooling efficiency. Particularly, the guide 16 may be a part separated from the semiconductor module body 10a. Thus, the guide 16 may be applied to the semiconductor module body 10a having a conventional structure so that it might not be required to change a design.

According to an embodiment, because the heat spreader causing the narrow gap between the semiconductor modules 10 might not be used, the cooling efficiency may be improved by decreasing the aspect ratio. The guide 16 may be provided to the downstream region DR to induce the flow of the cooling fluid to the lower portion 101 of the downstream region DR. Thus, the region having the low cooling efficiency such as the lower portion 101 of the downstream region DR may be effectively cooled to provide the semiconductor module 10 with the improved cooling efficiency. As a result, the semiconductor module 10 may have the simple structure and the improved cooling efficiency.

In an embodiment, the semiconductor device 14 may include the memory device so that the semiconductor module 10 may correspond to the memory module, but is not limited thereto. The guide 16 may be applied to various semiconductor modules perpendicular to the motherboard 110 and parallel to the flowing direction of the cooling fluid. For example, the guide 16 may be applied to a storage device such as a semiconductor disk or a solid state drive (SSD), a sound card, a graphic card, etc.

Further, the guide 16 may be provided to one semiconductor module 10. The guide 16 of the adjacent two semiconductor modules 10 may form the flow-blocking structure configured to block the upper portion 102 of the adjacent two semiconductor modules, but is not limited thereto.

Figure 10:
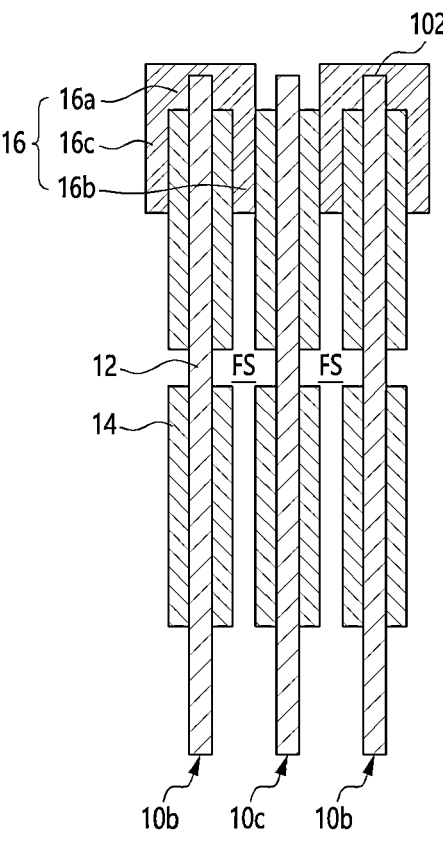
FIG. 10 is a cross-sectional view illustrating a system including a plurality of semiconductor modules in accordance with an embodiment.

FIG. 10 is a cross-sectional view illustrating a system including a plurality of semiconductor modules in accordance with an embodiment.

Referring to FIG. 10, a semiconductor module 10b with the guide 16 and a semiconductor module 10c without the guide 16 may be alternately stacked. The upper portion 102 of the semiconductor modules 10b and 10c may be blocked by the guide 16 of the semiconductor module 10b. For example, the guide 16 may include the guide body 16a and the extensions 16b and 16c like the guide 16 of the semiconductor module 10 in accordance with the first example embodiment. The extensions 16b and 16c may have a thickness thicker than the thickness of the extensions 16b and 16c of the semiconductor module 10 in accordance with the first example embodiment. Thus, the illustrations with respect to the guide 16 of the semiconductor module 10 in accordance with the first example embodiment may be applied to this example embodiment.

That is, the thickness of the guide 16 may correspond to the gap between the adjacent semiconductor modules 10b and 10c to block a space of the upper portion 102 of the adjacent semiconductor module 10b and 10c. Thus, numbers of the guide 16 may be reduced so that combination processes of the guide 16 may also be reduced to improve productivity.

Figure 11:
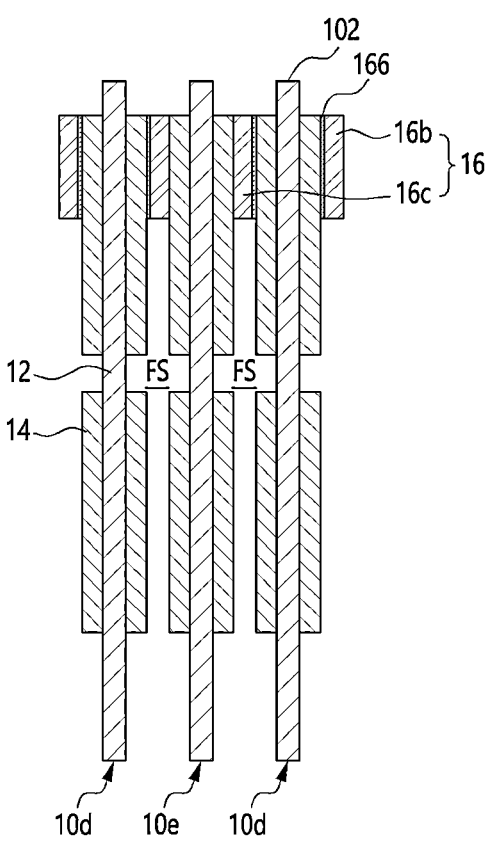
FIG. 11 is a cross-sectional view illustrating a system including a plurality of semiconductor modules in accordance with an embodiment.

FIG. 11 is a cross-sectional view illustrating a system including a plurality of semiconductor modules in accordance with an embodiment.

Referring to FIG. 11, the guide 16 may be arranged between two adjacent semiconductor modules 10d and 10e to block the upper portion 102 of the semiconductor modules 10d and 10e. For example, the guide 16 of this example embodiment may have a shape substantially the same as the shape of the extensions 16b and 16c of the semiconductor module 10 in accordance with the first example embodiment. The adhesive 166 may be provided to the at least one side of the extensions 16b and 16c so that the guide 16 may be attached to the upper portion 102 of the semiconductor module 10d. Thus, the illustrations with respect to the extension 16b and 16c of guide 16 of the semiconductor module 10 in accordance with the first example embodiment may be applied to this example embodiment.

The guide 16 might not include a portion on the upper portion 102 of the semiconductor modules 10d and 10e, i.e., the guide body 16a. That is, an upper end of the guide 16 may be substantially coplanar with the upper portion 102 of the semiconductor modules 10d and 10e. Alternatively, the upper end of the guide 16 may be positioned under the upper portion 102 of the semiconductor modules 10d and 10e. Thus, the guide 16 may be located without a space restriction in the upper portion 102 of the semiconductor modules 10d and 10e.

In FIG. 11, the guide 16 may be attached to both surfaces of one semiconductor module 10d. The semiconductor module 10d with the guide 16 and the semiconductor module 10e without the guide 16 may be alternately stacked. Thus, at least one of the semiconductor modules 10d and 10e may be selectively changed, but is not limited thereto. For example, the adhesive 166 may be provided to the both surfaces of the guide 16 to stably combine the guide 16 with the semiconductor modules 10d and 10e.

Hereinafter, a semiconductor module 10 of a second example embodiment applied to the system 100 in FIG. 1 may be illustrated with reference to FIGS. 12 and 13. Illustrations substantially the same as the above illustrations may be omitted herein for brevity. Further, illustrations with respect to the same or similar portions may be omitted herein for brevity. The above-described embodiments, changed embodiments, following embodiments, and combination thereof may be included in the scope of the present teachings. The semiconductor module 10 may include the semiconductor module body 10a and the guide 16 combined with the semiconductor module body 10a.

Figure 12:
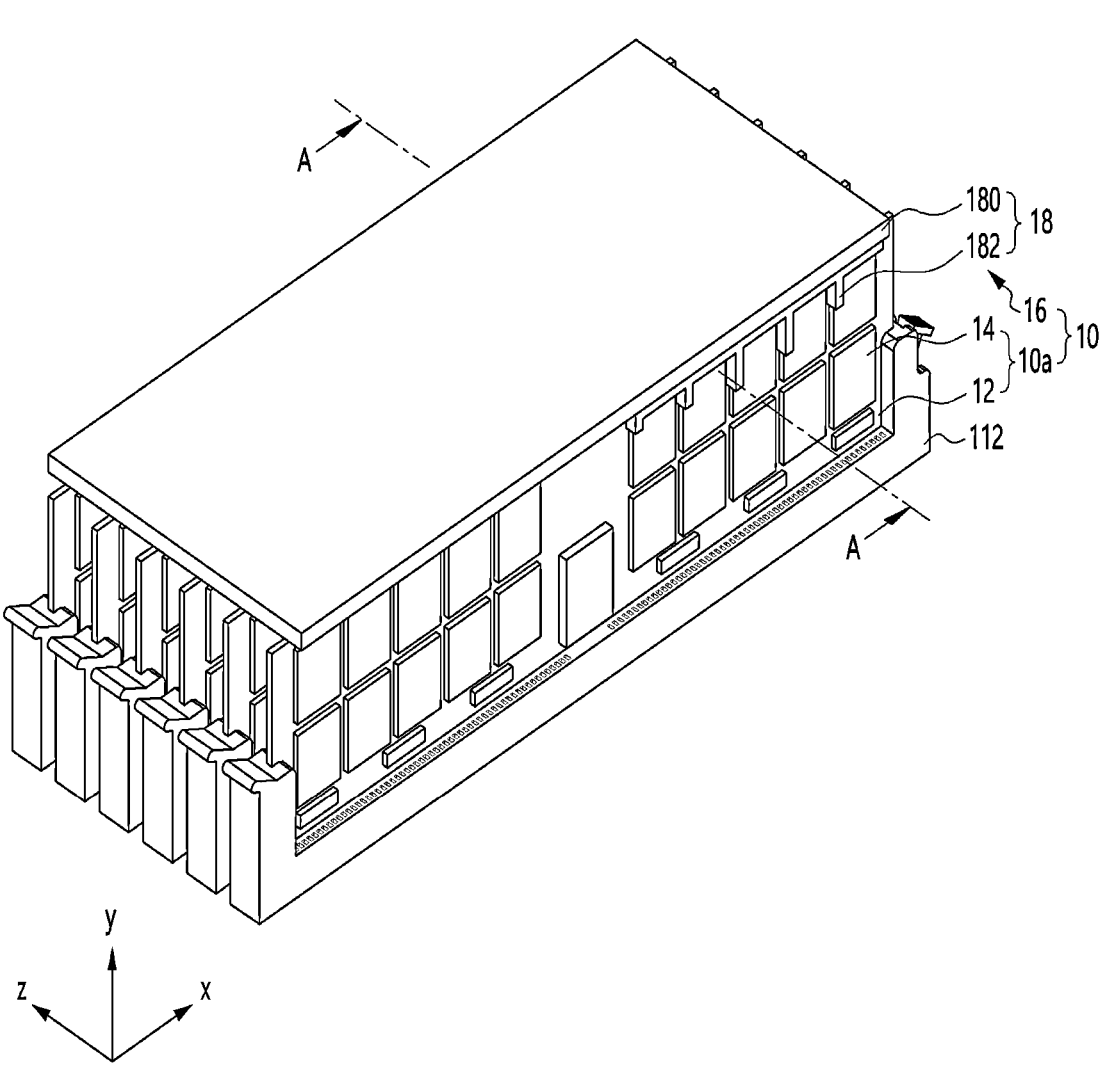
FIG. 12 is a perspective view illustrating a semiconductor module, a cover, and a connector for the semiconductor module in accordance with an embodiment.
Figure 13:
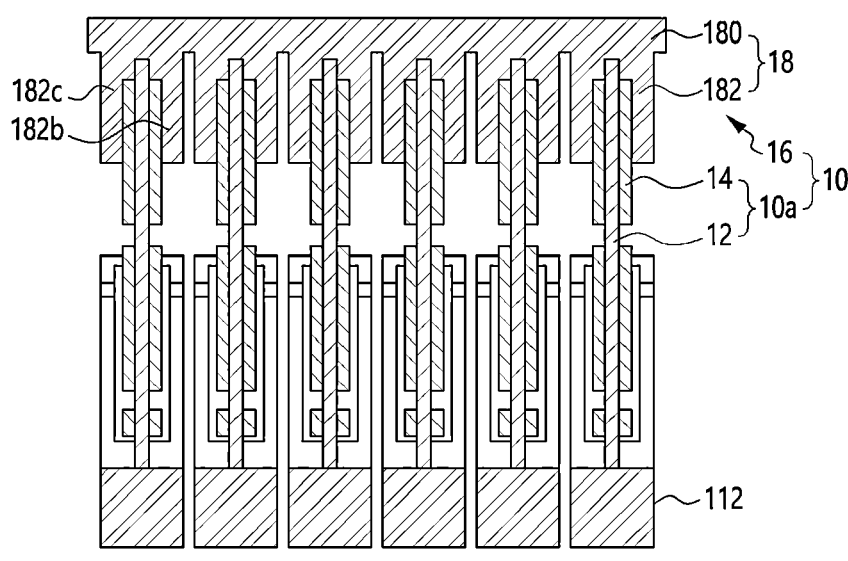
FIG. 13 is a cross-sectional view taken along a line A-A in FIG. 12.

FIG. 12 is a perspective view illustrating a semiconductor module, a cover, and a connector for the semiconductor module in accordance with an embodiment and FIG. 13 is a cross-sectional view taken along a line A-A in FIG. 12.

Referring to FIGS. 12 and 13, the guide 16 may be provided to the cover 18. For example, the guide 16 may include a guiding portion 182 protruded from a cover body 180 of the cover 18. In an embodiment, the guiding portion 182 may include a first extension 182b and a second extension 182c placed on the both surfaces of the semiconductor module 10. The explanations with respect to the extensions 16b and 16c of the guide 16 in FIG. 2 may be applied to shapes, positions, etc., of the first and second extensions 182b and 182c. That is, the extensions 182b and 182c may include a plurality of extended portions corresponding to the extended portions 160 in FIG. 3.

After the semiconductor module 10 may be installed at the connector 112, the cover 18 may be closed to combine the cover 18 with the semiconductor module body 10a, thereby combining the guide 16 with the guiding portion 182 with the semiconductor module body 10a. Thus, the cover 18 with the guiding portion 182 may induce the flow of the cooling fluid to the lower region without any change of the semiconductor module 10 to improve the cooling efficiency. Therefore, the guide 16 may be formed at a desired position without an additional space or an additional structure.

In FIGS. 12 and 13, the guiding portions 182 corresponding to the semiconductor modules 10 may be spaced apart from each other by a gap. In this case, the gap between guiding portions 182 may be very narrow to block the flow of the cooling fluid, but is not limited thereto. For example, the guiding portions 182 may closely make contact with each other to effectively block the flow of the cooling fluid at the upper region of the two adjacent semiconductor modules 10.

Alternatively, the single guiding portion 182 may be formed corresponding to the adjacent two semiconductor modules 10. This may be illustrated with reference to FIG. 14.

Figure 14:
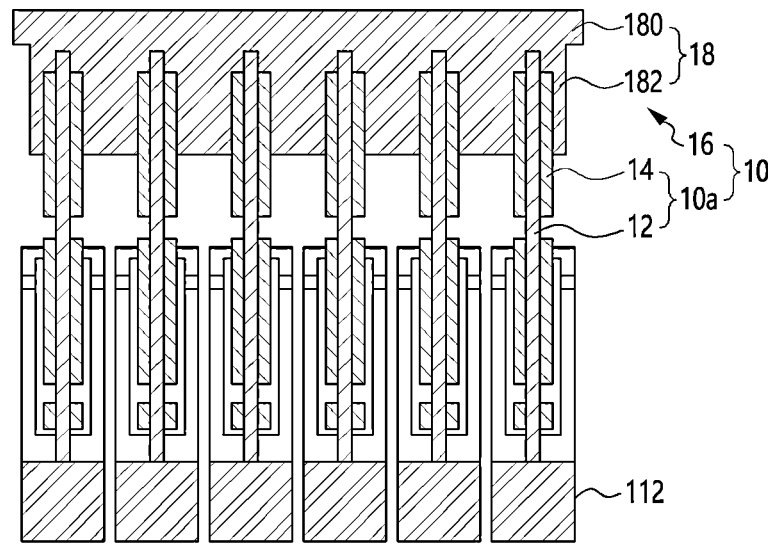
FIG. 14 is a cross-sectional view illustrating a system including a plurality of semiconductor modules in accordance with an embodiment.

FIG. 14 is a cross-sectional view illustrating a system including a plurality of semiconductor modules in accordance with an embodiment.

Referring to FIG. 14, the guiding portion 182 on the cover 18 as the guide 16 may be configured to block a space between upper ends of the two semiconductor modules 10. The single guiding portion 182 of the cover 18 may block the space between the upper ends of the two semiconductor modules 10. For example, the guiding portion 182 may include the extensions 16b and 16c of the guide 16 of the semiconductor module 10 in FIG. 2. The thickness of the guiding portion 182 may be thicker than the thickness of the extensions 16b and 16c of the guide 16 of the semiconductor module 10 in accordance with the first example embodiment. Thus, the explanations with respect to the extensions 16b and 16c of the guide 16 of the semiconductor module 10 in accordance with the first example embodiment except for the thickness of the extensions 16b and 16c may be applied to the guiding portion 182.

That is, the thickness of the guiding portion 182 may correspond to the gap between the upper ends of the semiconductor modules 10 so that the single guiding portion 182 may block the space between the upper ends of the semiconductor modules 10. Thus, numbers of the guiding portion 182 may be reduced so that a combination process of the guiding portion 182 may also be decreased to improve the productivity.

In FIGS. 12 to 14, the guiding portion 182 may be a part of the cover 18. The guiding portion 182 may be integrally formed with the cover 18 to have a simple structure. The cover body 180 of the cover 18 may include a transparent resin such as a transparent plastic. The guiding portion 182 may also include the transparent resin such as the transparent plastic.

The present disclosure is not restricted to the above-described embodiments. The guiding portion 182 may be a part separated from the cover body 180 of the cover 18. In this case, the guiding portion 182 may be attached to or combined with the cover body 180 of the cover 18. The cover body 180 of the cover and the guiding portion 182 functioning as the guide 16 may include materials requiring characteristics. For example, the cover body 180 of the cover 18 may include a transparent resin such as a transparent plastic. The guiding portion 182 may include a metal, a resin, a rubber, etc., different from the material of the cover body 180. When the guiding portion 182 may include the metal, the guiding portion 182 may more improve the cooling efficiency. When the guiding portion 182 may include the rubber, the combination stability may be improved and an external impact may be absorbed, but is not limited thereto. The structure and the material of the cover 18 with the guiding portion 182 may be variously changed.

The above-described embodiments of the present teachings are intended to illustrate and not to limit the present teachings. Various alternatives and equivalents are possible. The present teachings not limited by the embodiments described herein. Nor are the present teachings limited to any specific type of semiconductor device. Another additions, subtractions, and/or modifications are possible in view of the present disclosure and are intended to fall within the scope of the appended claims.

What is claimed is:

1. A semiconductor module comprising:
a semiconductor module body extending in a first direction and a second direction intersecting the first direction, the semiconductor module body including a plurality of connection terminals arranged at a lower portion of the semiconductor module body along the first direction and a plurality of semiconductor devices arranged on at least one surface of the semiconductor module body; and
a guide arranged at an upper portion of the semiconductor module body along the first direction to induce a flow of a cooling fluid to the lower portion of the semiconductor module body,
wherein the plurality of semiconductor devices includes a controller arranged in a central region on at least one surface of the semiconductor module body, a plurality of first memory devices arranged adjacent to one side of the controller and a plurality of second memory devices arranged adjacent to an other side of the controller,
wherein a region in which the plurality of first memory devices and the controller are arranged corresponds to an upstream region, and a region in which the plurality of second memory devices is arranged corresponds to a downstream region.

2. The semiconductor module of claim 1,
wherein the upstream region and the downstream region are sequentially positioned along the first direction, and
wherein the guide has a flow-blocking structure for blocking and interrupting the flow of the cooling fluid, the flow-blocking structure being positioned at the upper portion of the downstream region to induce the flow of the cooling fluid to the lower portion of the downstream region.

3. The semiconductor module of claim 2,
wherein a ratio of a widthwise length of the guide with respect to a widthwise length of the semiconductor module body in the first direction is 0.25 to 0.5, and
a longitudinal length of the guide is shorter than a longitudinal length of the semiconductor module body.

4. The semiconductor module of claim 1,
wherein the guide includes at least one extension including a plurality of extended portions, and
wherein the extended portions extend on at least one surface of the semiconductor module body from the upper portion toward the lower portion.

5. The semiconductor module of claim 4,
wherein at least one of the extended portions overlaps at least one of the plurality of second memory devices arranged at the downstream region.

6. The semiconductor module of claim 5,
wherein at least one of the extended portions is arranged between the second memory devices arranged at the downstream region.

7. The semiconductor module of claim 5,
wherein the plurality of second memory devices include a first device spaced apart from the controller, a second device adjacent to the controller, and at least one internal device between the first and second devices.

8. The semiconductor module of claim 7,
wherein when the at least one internal device comprises multiple internal devices, the extended portions include at least one internal extended portion positioned between the internal devices.

9. The semiconductor module of claim 8,
wherein the extended portions further include a first extended portion positioned between the first device and an internal device adjacent to the first device and a second extended portion positioned between the second device and an internal device adjacent to the second device, and
wherein a length of the internal extended portion is longer than lengths of the first and second extended portions.

10. The semiconductor module of claim 4,
wherein ends of the extended portions have a streamlined shape in the flow direction of the cooling fluid.

11. The semiconductor module of claim 4,
wherein the at least one extension includes a first extension on one surface of the semiconductor module body and a second extension on the other surface of the semiconductor module body, and
the first extension and the second extension are symmetrically arranged with respect to the semiconductor module body.

12. The semiconductor module of claim 4,
wherein the guide includes a guide body positioned on the upper portion of the semiconductor module body, the guide body has a plate shape configured to make contact with the upper portion, and the at least one extension is connected to the guide body.

13. The semiconductor module of claim 1,
wherein the guide is fixed to the semiconductor module body by at least one of an insertion combination, a combination by a resilient force, a combination by a frictional force, and an adhesive.

14. The semiconductor module of claim 1, further comprising:
a cover covering the semiconductor module body.

15. The semiconductor module of claim 1,
wherein the guide comprises at least one of a metal, a rubber, and a resin.

16. A system comprising:

a plurality of semiconductor modules extending in a first direction and a second direction intersecting with the first direction, the plurality of semiconductor modules spaced apart from each other in a third direction perpendicular to the first direction and the second direction; and a cooling member on one side of the plurality of semiconductor modules in the first direction to supply a cooling fluid to the plurality of semiconductor modules, wherein at least one of the plurality of semiconductor modules includes:

a semiconductor module body, the semiconductor module body including a plurality of connection terminals at a lower portion of the semiconductor module body in the second direction, and a guide positioned at an upper portion of the semiconductor module body opposite to the lower portion of the semiconductor module body to induce a flow of a cooling fluid from the cooling member to the lower portion of the semiconductor module body;

wherein the guide is fixed to the semiconductor module body by at least one of an insertion combination, a combination by a resilient force, a combination by a frictional force, and an adhesive.

17. The system of claim 16, wherein the semiconductor module body includes an upstream region and a downstream region in a flow direction of the cooling fluid, and wherein the guide is arranged on the downstream region and the guide has a flow-blocking structure for blocking and interrupting the flow of the cooling fluid, the flow-blocking structure being positioned at the upper portion of the downstream region to induce the flow of the cooling fluid to the lower portion of the downstream region.

18. The system of claim 17, wherein a flow space through which the cooling fluid flows is defined between adjacent semiconductor modules among the plurality of semiconductor modules, and an aspect ratio of the flow space in the downstream region is lower than an aspect ratio of the flow space in the upstream region without the guide.

19. The system of claim 16, wherein the guide includes a guiding portion provided to a cover configured to cover the upper portion of the semiconductor module body and the guide is fixed to the semiconductor module body by combining the cover with the semiconductor module body.

* * * * *